United States Patent
Miyamoto (10) Patent No.: US 7,245,545 B2
(45) Date of Patent: Jul. 17, 2007

(54) MEMORY

(75) Inventor: Hideaki Miyamoto, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 33 days.

(21) Appl. No.: 11/228,215

(22) Filed: Sep. 19, 2005

(65) Prior Publication Data

US 2006/0067151 A1 Mar. 30, 2006

(30) Foreign Application Priority Data

Sep. 24, 2004 (JP) ............................. 2004-276461

(51) Int. Cl.
*G11C 7/00* (2006.01)
(52) U.S. Cl. ...................... 365/222; 365/194
(58) Field of Classification Search ............... 365/222, 365/194
See application file for complete search history.

(56) References Cited

U.S. PATENT DOCUMENTS

| | | | |
|---|---|---|---|
| 6,141,279 A * | 10/2000 | Hur et al. | 365/222 |
| 6,144,605 A * | 11/2000 | Park | 365/222 |
| 6,563,755 B2 | 5/2003 | Yahata et al. | |
| 6,795,363 B2 | 9/2004 | Nakashima et al. | |
| 6,930,945 B2 * | 8/2005 | Takahashi | 365/222 |

FOREIGN PATENT DOCUMENTS

| | | |
|---|---|---|
| JP | 2001-229674 A | 8/2001 |
| JP | 2002-208274 | 7/2002 |
| JP | 2003-7051 | 1/2003 |
| JP | 2003-187575 | 7/2003 |
| KR | 2003-0051205 | 6/2003 |

OTHER PUBLICATIONS

Office Action for Corresponding Application No. 10-2005-88546, Dispatch Date: Jul. 27, 2006.

* cited by examiner

*Primary Examiner*—Anh Phung
(74) *Attorney, Agent, or Firm*—McDermott Will & Emery LLP (57) ABSTRACT

A memory capable of performing a refresh operation without increasing current consumption is provided. This memory comprises a plurality of memory cells storing data, a delay circuit outputting a first address signal corresponding to the memory cells received from outside for a normal access operation with a delay of a prescribed period, a refresh control circuit outputting a second address signal corresponding to any of the memory cells subjected to a refresh operation of the data and a switching circuit switching and outputting the first address signal output from the delay circuit and the second address signal output from the refresh control circuit.

20 Claims, 3 Drawing Sheets

MEMORY

BACKGROUND OF THE INVENTION

1. Field of the Invention

The present invention relates to a memory, and more particularly, it relates to a memory refreshing data stored in memory cells.

2. Description of the Background Art

In general, a DRAM (dynamic random access memory) is known as an exemplary memory refreshing data stored in memory cells, as disclosed in Japanese Patent Laying-Open No. 2001-229674, for example. The conventional DRAM disclosed in Japanese Patent Laying-Open No. 2001-229674 performs a normal access operation (read or write operation) synchronously with a first clock signal having a prescribed cycle and performs a refresh operation synchronously with a high-speed second clock signal having a cycle shorter than the prescribed cycle of the first clock signal, thereby performing the refresh operation in an idle time between normal access operations. On the other hand, a ferroelectric memory utilizing pseudo capacitance change responsive to the polarization direction of a ferroelectric substance as a memory element has recently been known as another exemplary memory refreshing data stored in memory cells. In relation to this ferroelectric memory, disturbance is known as a phenomenon causing data disappearance in a rewrite operation following a read operation or a write operation on memory cells including ferroelectric capacitors due to reduction of polarization quantities of the ferroelectric capacitors caused by application of a prescribed voltage to memory cells connected to word lines other than a selected word line. In order to suppress this disturbance, the conventional ferroelectric memory refreshes the data stored in the memory cells.

In the aforementioned DRAM disclosed in Japanese Patent Laying-Open No. 2001-229674, however, current consumption is disadvantageously increased due to the refresh operation with the high-speed second clock signal having the cycle shorter than that of the first clock signal employed for the normal access operation. Also when the technique related to the refresh operation of the DRAM disclosed in Japanese Patent Laying-Open No. 2001-229674 is applied to the refresh operation of the ferroelectric memory, current consumption is still disadvantageously increased.

SUMMARY OF THE INVENTION

The present invention has been proposed in order to solve the aforementioned problem, and an object of the present invention is to provide a memory capable of performing a refresh operation without increasing current consumption.

In order to attain the aforementioned object, a memory according to a first aspect of the present invention comprises a plurality of memory cells storing data, a delay circuit outputting a first address signal corresponding to the memory cells received from outside for a normal access operation with a delay of a prescribed period, a refresh control circuit outputting a second address signal corresponding to any of the memory cells subjected to a refresh operation of the data and a switching circuit switching and outputting the first address signal output from the delay circuit and the second address signal output from the refresh control circuit.

As hereinabove described, the memory according to the first aspect, provided with the delay circuit outputting the first address signal, corresponding to the memory cells, received from outside for the normal access operation with the delay of the prescribed period, the refresh control circuit outputting the second address signal corresponding to any of the memory cells subjected to the refresh operation of the data and the switching circuit switching and outputting the first address signal output from the delay circuit and the second address signal output from the refresh control circuit, can produce an idle time for performing no normal access operation through the delay circuit without employing a high-speed clock signal and perform the refresh operation in this idle time through the refresh control circuit and the switching circuit by outputting the second address signal from the switching circuit and performing the refresh operation on the memory cell corresponding to the output second address signal in the prescribed period when the delay circuit delays the first address signal. Thus, the memory can perform the refresh operation without increasing current consumption.

The aforementioned memory according to the first aspect preferably outputs the second address signal from the switching circuit and performs the refresh operation on the memory cell corresponding to the second address signal in the prescribed period when the delay circuit delays the first address signal. According to this structure, the memory can easily perform the refresh operation in the prescribed period when the delay circuit delays the first address signal.

In this case, the memory preferably further comprises a plurality of word lines and a plurality of bit lines arranged to intersect with each other so that the memory cells are provided on the intersectional positions between the plurality of word lines and the plurality of bit lines respectively, for performing the refresh operation on all memory cells linked with a single word line corresponding to the second address signal in the prescribed period when the delay circuit delays the first address signal. According to this structure, the memory can suppress remarkable delay of the normal access operation on the memory cells corresponding to the first address signal since the delay circuit may simply delay the first address signal by the time for performing the refresh operation on all memory cells linked with the single word line when delaying the first address signal for producing the idle time for the refresh operation.

In this case, further, the memory preferably successively performs the refresh operation one by one on all word lines every normal access operation. According to this structure, the memory can successively perform the refresh operation on the memory cells linked with each word line every normal access operation, so that the same can easily perform the refresh operation on all memory cells linked with all word lines.

In the aforementioned memory according to the first aspect, the refresh control circuit preferably includes an access frequency detection circuit detecting access frequencies to the memory cells, for performing the refresh operation on the memory cell corresponding to the second address signal in response to the second address signal output from the switching circuit in place of the first address signal when the access frequency detection circuit detects that the sum of the access frequencies has reached a prescribed value. According to this structure, the memory can reliably inhibit the memory cells from data disappearance since the same can start the refresh operation before reaching a prescribed access frequency causing data disappearance by setting the aforementioned prescribed value to a level requiring the refresh operation for avoiding data disappearance.

In the aforementioned memory according to the first aspect, the refresh control circuit preferably includes an access time measuring circuit measuring access times to the memory cells, for performing the refresh operation on the memory cell corresponding to the second address signal in response to the second address signal output from the switching circuit in place of the first address signal when the sum of the access times measured by the access time measuring circuit reaches a prescribed time. According to this structure, the memory can reliably inhibit the memory cells from data disappearance since the same can start the refresh operation before reaching a prescribed access time causing data disappearance by setting the aforementioned prescribed time to a level requiring the refresh operation for avoiding data disappearance.

The aforementioned memory according to the first aspect preferably further comprises an address holding circuit holding the first address signal corresponding to the memory cells subjected to the normal access operation, and the delay circuit preferably delays and outputs the first address signal held by the address holding circuit. According to this structure, the address holding circuit can hold the first address signal received before the memory starts the refresh operation during the period of the refresh operation, whereby the delay circuit can reliably output the first address signal received before the refresh operation after the refresh operation.

In the aforementioned memory according to the first aspect, the delay circuit preferably includes a plurality of serially connected delay circuit parts, for outputting the first address signal with a delay of the prescribed period by outputting the first address signal from each of the plurality of delay circuit parts with a delay of one clock. According to this structure, the delay circuit can easily output the first address signal with the delay of the prescribed period.

In the aforementioned memory according to the first aspect, the switching circuit preferably includes a first transistor receiving the first address signal from the delay circuit and a second transistor receiving the second address signal from the refresh control circuit, for outputting the first address signal through the first transistor by turning on the first transistor and turning off the second transistor in the normal access operation and outputting the second address signal through the second transistor by turning off the first transistor and turning on the second transistor in the refresh operation. According to this structure, the switching circuit can easily switch and output the first and second address signals in the normal access operation and the refresh operation respectively.

The aforementioned memory according to the first aspect preferably further comprises a plurality of word lines and a plurality of bit lines arranged to intersect with each other, while the memory cells are preferably arranged on positions corresponding to the intersections between the plurality of word lines and the plurality of bit lines respectively and preferably include ferroelectric capacitors connected to the corresponding word lines and the corresponding bit lines for storing the data. According to this structure, a cross-point ferroelectric memory can be constituted of the memory cells, including the ferroelectric capacitors, arranged on the intersections between the plurality of word lines and the plurality of bit lines respectively. Thus, the cross-point ferroelectric memory can perform the refresh operation in an idle time produced by the delay circuit, so that the same can perform the refresh operation without increasing current consumption.

The aforementioned memory according to the first aspect preferably further comprises a plurality of word lines and a plurality of bit lines arranged to intersect with each other, while the memory cells are preferably arranged on positions corresponding to the intersections between the plurality of word lines and the plurality of bit lines respectively and preferably include transistors having either sources or drains connected to the corresponding bit lines as well as capacitors having first electrodes connected to either the drains or the sources of the transistors and grounded second electrodes for storing the data. According to this structure, a DRAM can be constituted of the memory cells including the capacitors storing the data and the transistors for selecting the capacitors. Thus, the DRAM can perform the refresh operation in an idle time produced by the delay circuit, so that the same can perform the refresh operation without increasing current consumption.

A memory according to a second aspect of the present invention comprises a plurality of word lines and a plurality of bit lines arranged to intersect with each other, a plurality of memory cells arranged on positions corresponding to the intersections between the plurality of word lines and the plurality of bit lines respectively and including ferroelectric capacitors connected to the corresponding word lines and the corresponding bit lines for storing data, a delay circuit outputting a first address signal corresponding to the memory cells received from outside for a normal access operation with a delay of a prescribed period, a refresh control circuit outputting a second address signal corresponding to any of the memory cells subjected to a refresh operation of the data and a switching circuit switching and outputting the first address signal output from the delay circuit and the second address signal output from the refresh control circuit.

As hereinabove described, the memory according to the second aspect, i.e., a cross-point ferroelectric memory comprising the memory cells including the ferroelectric capacitors arranged on the intersections between the plurality of word lines and the plurality of bit lines respectively, provided with the delay circuit outputting the first address signal, corresponding to the memory cells, received from outside for the normal access operation with the delay of the prescribed period, the refresh control circuit outputting the second address signal corresponding to any of the memory cells subjected to the refresh operation of the data and the switching circuit switching and outputting the first address signal output from the delay circuit and the second address signal output from the refresh control circuit, can produce an idle time for performing no normal access operation through the delay circuit without employing a high-speed clock signal and perform the refresh operation in this idle time through the refresh control circuit and the switching circuit by outputting the second address signal from the switching circuit and performing the refresh operation on the memory cell corresponding to the output second address signal in the prescribed period when the delay circuit delays the first address signal. Thus, the cross-point ferroelectric memory can perform the refresh operation without increasing current consumption.

The aforementioned memory according to the second aspect preferably outputs the second address signal from the switching circuit and performs the refresh operation on the memory cell corresponding to the second address signal in the prescribed period when the delay circuit delays the first address signal. According to this structure, the memory can easily perform the refresh operation in the prescribed period when the delay circuit delays the first address signal.

In this case, the memory preferably performs the refresh operation on all memory cells linked with a single word line corresponding to the second address signal in the prescribed period when the delay circuit delays the first address signal. According to this structure, the memory can suppress a remarkable delay of the normal access operation on the memory cells corresponding to the first address signal since the delay circuit may simply delay the first address signal by the time for performing the refresh operation on all memory cells linked with the single word line when delaying the first address signal for producing the idle time for the refresh operation.

In this case, further, the memory preferably successively performs the refresh operation one by one on all word lines every normal access operation. According to this structure, the memory can successively perform the refresh operation on the memory cells linked with each word line every normal access operation, so that the same can easily perform the refresh operation on all memory cells linked with all word lines.

In the aforementioned memory according to the second aspect, the refresh control circuit preferably includes an access frequency detection circuit detecting access frequencies to the memory cells, for performing the refresh operation on the memory cell corresponding to the second address signal in response to the second address signal output from the switching circuit in place of the first address signal when the access frequency detection circuit detects that the sum of the access frequencies has reached a prescribed value. According to this structure, the memory can reliably inhibit the memory cells from data disappearance since the same can start the refresh operation before reaching a prescribed access frequency causing data disappearance by setting the aforementioned prescribed value to a level requiring the refresh operation for avoiding data disappearance.

In the aforementioned memory according to the second aspect, the refresh control circuit preferably includes an access time measuring circuit measuring access times to the memory cells, for performing the refresh operation on the memory cell corresponding to the second address signal in response to the second address signal output from the switching circuit in place of the first address signal when the sum of the access times measured by the access time measuring circuit reaches a prescribed time. According to this structure, the memory can reliably inhibit the memory cells from data disappearance since the same can start the refresh operation before reaching a prescribed access time causing data disappearance by setting the aforementioned prescribed time to a level requiring the refresh operation for avoiding data disappearance.

The aforementioned memory according to the second aspect preferably further comprises an address holding circuit holding the first address signal corresponding to the memory cells subjected to the normal access operation, while the delay circuit preferably delays and outputs the first address signal held by the address holding circuit. According to this structure, the address holding circuit can hold the first address signal received before the memory starts the refresh operation during the period of the refresh operation, whereby the delay circuit can reliably output the first address signal received before the refresh operation after the refresh operation.

In the aforementioned memory according to the second aspect, the delay circuit preferably includes a plurality of serially connected delay circuit parts, for outputting the first address signal with a delay of the prescribed period by outputting the first address signal from each of the plurality of delay circuit parts with a delay of one clock. According to this structure, the delay circuit can easily output the first address signal with the delay of the prescribed period.

In the aforementioned memory according to the second aspect, the switching circuit preferably includes a first transistor receiving the first address signal from the delay circuit and a second transistor receiving the second address signal from the refresh control circuit, for outputting the first address signal through the first transistor by turning on the first transistor and turning off the second transistor in the normal access operation and outputting the second address signal through the second transistor by turning off the first transistor and turning on the second transistor in the refresh operation. According to this structure, the switching circuit can easily switch and output the first and second address signals in the normal access operation and the refresh operation respectively.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings. In each of the embodiments described below, the present invention is applied to a cross-point ferroelectric memory having memory cells each constituted of only a single ferroelectric capacitor arranged on the intersectional position between a word line and a bit line.

(First Embodiment)

Figure 2:
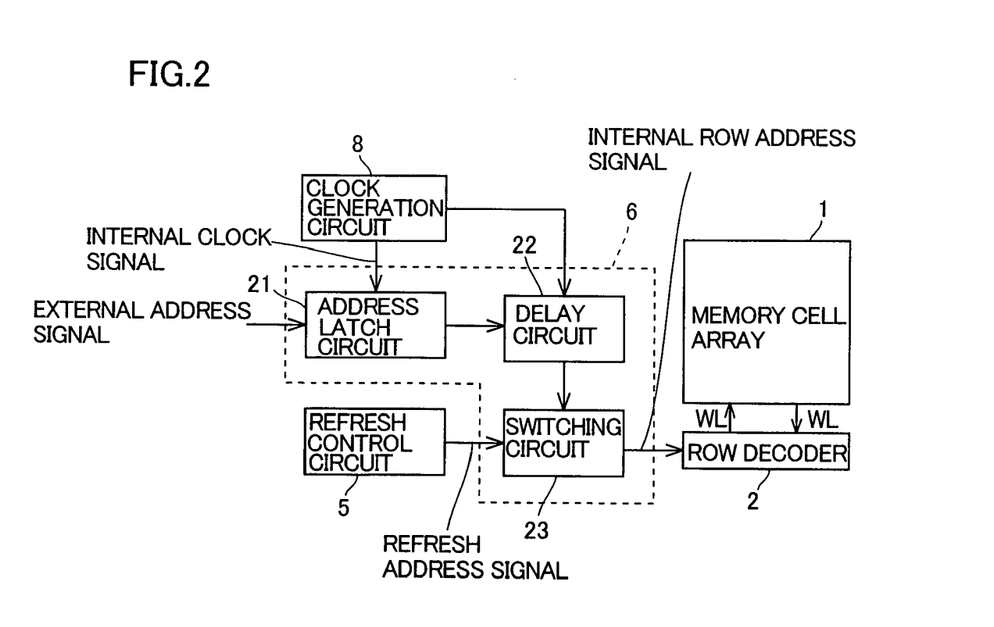
FIG. 2 is a block diagram for illustrating the structures of a refresh control circuit, a clock generation circuit and a row address buffer in the cross-point ferroelectric memory according to the first embodiment shown in FIG. 1.
Figure 3:
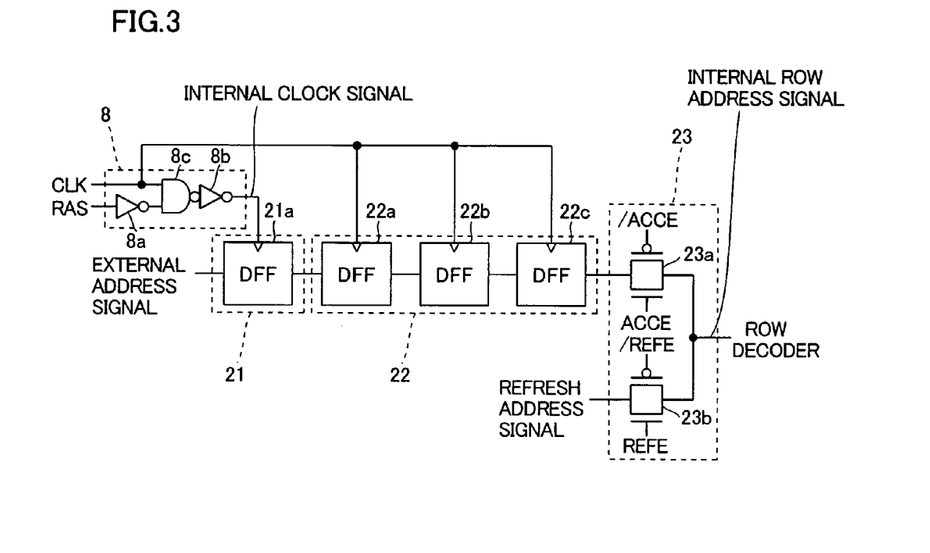
FIG. 3 is a circuit diagram for illustrating the circuit structures of the refresh control circuit, the clock generation circuit and the row address buffer in the cross-point ferroelectric memory according to the first embodiment shown in FIG. 2.

The structure of a cross-point ferroelectric memory according to a first embodiment of the present invention is described with reference to FIGS. 1 to 3.

Figure 1:
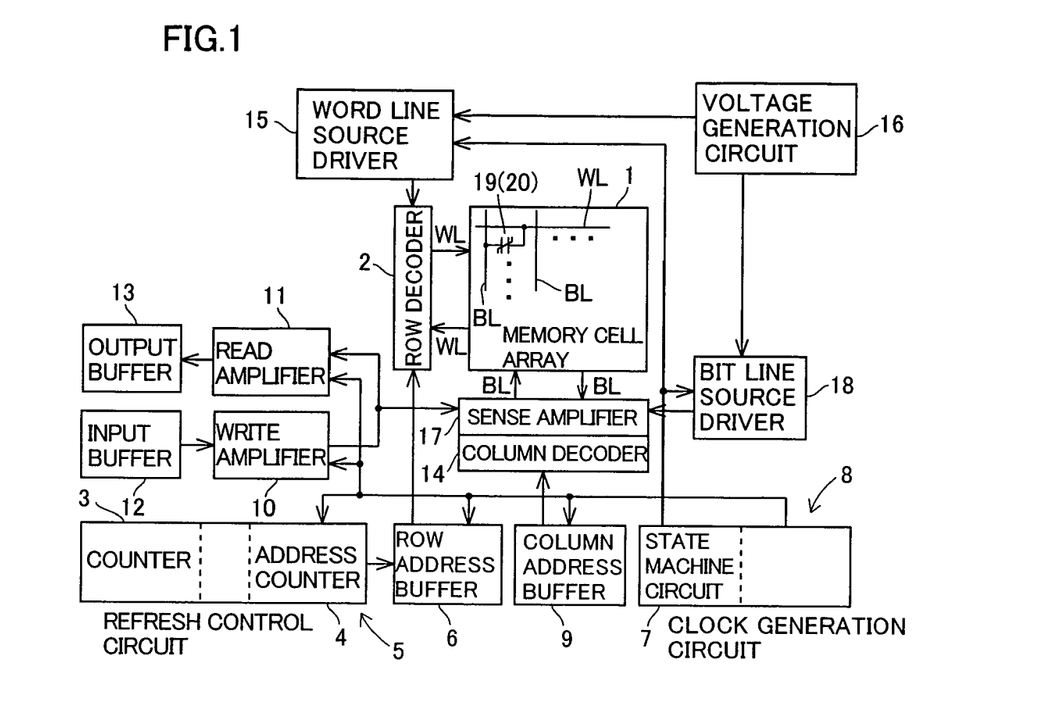
FIG. 1 is a block diagram showing the overall structure of a cross-point ferroelectric memory according to a first embodiment of the present invention.

The cross-point ferroelectric memory according to the first embodiment comprises a memory cell array 1, a row decoder 2, a refresh control circuit 5 including a counter 3 and an address counter 4, a row address buffer 6, a clock generation circuit 8 including a state machine circuit 7, a column address buffer 9, a write amplifier 10, a read amplifier 11, an input buffer 12, an output buffer 13, a column decoder 14, a word line source driver 15, a voltage generation circuit 16, a sense amplifier 17 and a bit line source driver 18, as shown in FIG. 1. The counter 3 is an example of the "access frequency detection circuit" in the present invention.

In the memory cell array 1, a plurality of word lines WL and a plurality of bit lines BL are arranged to intersect with each other, while memory cells 20 formed by only single ferroelectric capacitors 19 are arranged on the intersections therebetween respectively. The ferroelectric capacitors 19 include the word lines WL, the bit lines BL and ferroelectric films (not shown) arranged between the word lines WL and the bit lines BL. The word lines WL are connected with the row decoder 2. The row decoder 2 is connected with the row address buffer 6.

According to the first embodiment, the refresh control circuit 5 is provided for controlling data refresh operations on the memory cells 20. The counter 3 of the refresh control circuit 5 is provided for detecting access frequencies to all memory cells 20 included in the memory cell array 1. More specifically, the counter 3 is so formed as to count up by +1 every time the memory performs a normal access operation or a refresh operation on all memory cells 20 included in the memory cell array 1. The refresh control circuit 5 is formed to output a refresh address signal for the row address of a word line WL linked with the memory cells 20 subjected to the refresh operation, a high-level refresh request signal REFE and a low-level inverted refresh request signal /REFE to a switching circuit 23 of the row address buffer 6 described later when the counter 3 detects that the sum of the access frequencies has reached a prescribed value. The address counter 4 of the refresh control circuit 5 is provided for detecting the refresh operation frequency every word line WL. In other words, the address counter 4 is formed to count up the refresh operation frequency corresponding to a prescribed word line WL by +1 every time the memory performs the refresh operation through the prescribed word line WL.

The row address buffer 6 is provided for supplying a prescribed row address signal to the row decoder 2. The row decoder 2 is formed to activate a word line WL corresponding to the prescribed row address signal supplied from the row address buffer 6 in the normal access operation and the refresh operation. This row address buffer 6 is formed by an address latch circuit 21, a delay circuit 22 and a switching circuit 23, as shown in FIG. 2. The address latch circuit 21 is an example of the "address holding circuit" in the present invention. The address latch circuit 21 is formed to receive an external address signal from outside and to hold the received external address signal when the memory performs the normal access operation. This address latch circuit 21 is formed by a DFF (delay flip-flop) circuit 21a, as shown in FIG. 3. The DFF circuit 21a of the address latch circuit 21 receives an internal clock signal from the clock generation circuit 8.

According to the first embodiment, the delay circuit 22 is connected to the address latch circuit 21, for receiving the external address signal (row address of a word line WL subjected to the normal access operation) held in the address latch circuit 21. This delay circuit 22 is constituted of serially connected three-stage DFF circuits 22a to 22c, as shown in FIG. 3. The DFF circuits 22a to 22c are examples of the "delay circuit parts" in the present invention. A clock signal CLK is input in the three-stage DFF circuits 22a to 22c respectively. Each of the DFF circuits 22a to 22c has a function of delaying the external address signal by one clock. Thus, the delay circuit 22 outputs the external address signal received from the address latch circuit 21 with a delay of three clocks through the three-stage DFF circuits 22a to 22c.

The switching circuit 23 is constituted of two transfer gate transistors 23a and 23b. The transfer gate transistor 23a is an example of the "first transistor" in the present invention, and the transfer transistor 23b is an example of the "second transistor" in the present invention. The transfer gate transistors 23a and 23b are formed by p- and n-channel transistors having sources and drains connected with each other respectively. The delay circuit 22 inputs the external address signal in either the source or the drain of the transfer gate transistor 23a of the switching circuit 23, while the refresh control circuit 5 inputs the refresh address signal for the row address of the word line WL linked with the memory cells 20 subjected to the refresh operation in either the source or the drain of the other transfer gate transistor 23b. Either the drain or the source of the transfer gate transistor 23a is connected with either the drain or the source of the transfer gate transistor 23b. An access enable signal ACCE is input in the gate of the n-channel transistor forming the transfer gate transistor 23a, while an inverted access enable signal /ACCE is input in the gate of the p-channel transistor forming the transfer gate transistor 23a. The refresh request signal REFE is input in the gate of the n-channel transistor forming the transfer gate transistor 23b, while the inverted refresh request signal /REFE is input in the gate of the p-channel transistor forming the transfer gate transistor 23b.

Either the source or the drain of the transfer gate transistor 23a or 23b outputs either the external address signal or the refresh address signal to the row decoder 2 as an internal row address signal. In other words, the switching circuit 23 is formed to output the external address signal through the transfer gate transistor 23a when turning on the transfer gate transistor 23a while turning off the transfer gate transistor 23b, and to output the refresh address signal through the transfer gate transistor 23b when turning on the transfer gate transistor 23b while turning off the transfer gate transistor 23a. Thus, the switching circuit 23 can switch and output the external address signal received from outside when the memory performs the normal access operation and the refresh address signal corresponding to the memory cells 20 subjected to the refresh operation.

The clock generation circuit 8 includes inverter circuits 8a and 8b and a NAND circuit 8c. A row address strobe signal RAS is input in the inverter circuit 8a. The clock signal CLK and an output of the inverter circuit 8a are input in the NAND circuit 8c. An output of the NAND circuit 8c is input in the inverter circuit 8b. The inverter circuit 8b outputs an internal clock signal to the address latch circuit 21. The clock generation circuit 8 is connected with the refresh control circuit 5, the column address buffer 9, the write amplifier 10 and the read amplifier 11, as shown in FIG. 1. The input buffer 12 and the output buffer 13 are connected to the write amplifier 10 and the read amplifier 11 respectively. The column address buffer 9 is connected to the column decoder 14. The word line source driver 15 is connected to the row decoder 2, while the voltage generation circuit 16 and the state machine circuit 7 of the clock generation circuit 8 are connected to the word line source driver 15. The column decoder 14 is connected to the bit lines BL of the memory cell array 1 through the sense amplifier 17. The write amplifier 10, the read amplifier 11 and the bit line source driver 18 are connected to the sense amplifier 17, while the voltage generation circuit 16 and the state machine circuit 7 are connected to the bit line source driver 18.

Operations of the cross-point ferroelectric memory according to the first embodiment of the present invention are now described with reference to FIGS. 1 to 4. The cross-point ferroelectric memory according to the first embodiment operates synchronously with a clock signal CLK received from outside.

Figure 4:
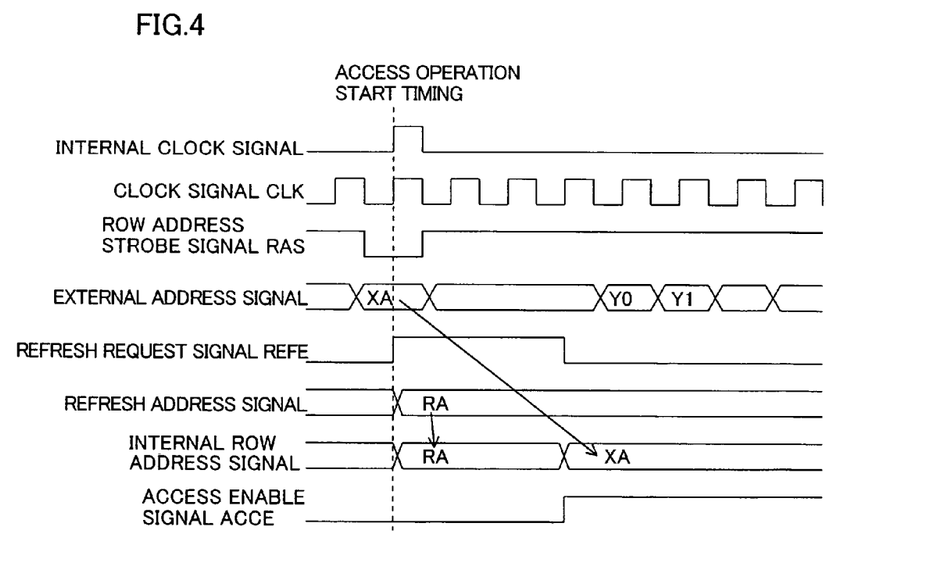
FIG. 4 is a voltage waveform diagram for illustrating operations of the cross-point ferroelectric memory according to the first embodiment of the present invention.

As shown in FIG. 4, the row address strobe signal RAS input in the inverter circuit 8a of the clock generation circuit 8 (see FIG. 3) falls from a high level to a low level. Thus, the inverter circuit 8a outputs a high-level signal and inputs the same in the NAND circuit 8c. The counter 3 of the refresh control circuit 4 (see FIG. 1) counts up by +1 in response to the fall of the row address strobe signal RAS. Thus, the counter 3 detects the access frequency. Thereafter the clock signal CLK input in the NAND circuit 8c of the clock generation circuit 8 (see FIG. 3) rises from a low level to a high level, whereby the NAND circuit 8c outputs a low-level signal. The clock signal CLK rises from the low level to the high level at access operation start timing when the row address strobe signal RAS is at the low level. The inverter circuit 8b receives the low-level signal output from the NAND circuit 8c, thereby outputting a high-level internal clock signal. The DFF circuit 21a of the address latch circuit 21 receives this high-level internal clock signal. Thus, the address latch circuit 21 holds an external address signal XA currently received from outside.

Thereafter the first-stage DFF circuit 22a of the delay circuit 22 receives the external address signal XA held in the address latch circuit 21. Each of the three-stage DFF circuits 22a to 22c delays the external address signal XA by one clock and outputs the same. Thus, the third-stage DFF circuit 22c outputs the external address signal XA with a delay of three clocks from the access operation start timing. The external address signal XA output from the DFF circuit 22c with the delay of three clocks is input in either the source or the drain of the transfer gate transistor 23a of the switching circuit 23. At this time, the access enable signal ACCE input in the gate of the n-channel transistor forming the transfer gate transistor 23a rises to a high level while the inverted access enable signal /ACCE input in the gate of the p-channel transistor forming the transfer gate transistor 23a falls to a low level. Thus, the transfer gate transistor 23a enters an ON-state, thereby outputting the external address signal XA received from the delay circuit 22 therethrough. Thus, the switching circuit 23 inputs an internal row address signal XA corresponding to the external address signal XA in the row decoder 2 (see FIG. 1).

The row decoder 2 activates the word line WL corresponding to the internal row address signal XA, and the memory performs a normal access operation (read or write operation) on the memory cells 20 linked with the activated word line WL through the bit lines BL. In the read operation of the normal access operation, the memory collectively reads data stored in all memory cells 20 linked with the activated word line WL through the bit lines BL. Data are destroyed in some of the memory cells 20 in this read operation, and hence the memory performs a rewrite operation after this read operation. In this rewrite operation, the memory rewrites the data by amplifying the voltages of the read data with the sense amplifier 17 and thereafter applying the amplified voltages to the ferroelectric capacitors 19 of the memory cells 20 from which the data have been read through the bit lines BL. In the write operation of the normal access operation, on the other hand, the memory collectively writes data in all memory cells 20 linked with the activated word line WL through the bit lines BL.

When the transfer gate transistor 23a outputs the external address signal XA, the refresh request signal REFE input in the gate of the n-channel transistor forming the other transfer gate transistor 23b of the switching circuit 23 falls to a low level while the inverted refresh request signal /REFE input in the gate of the p-channel transistor forming the transfer gate transistor 23b rises to a high level. Thus, the transfer gate transistor 23b enters an OFF-state. When the transfer gate transistor 23a of the switching circuit 23 outputs the external address signal XA, therefore, the other transfer gate transistor 23b outputs no refresh address signal.

In the period when the delay circuit 2 delays the external address signal XA by three clocks, the access enable signal ACCE input in the gate of the n-channel transistor forming the transfer gate transistor 23a is held at a low level while the inverted access enable signal /ACCE input in the gate of the p-channel transistor forming the transfer gate transistor 23a is held at a high level. Thus, the transfer gate transistor 23a of the switching circuit 23 is held in the OFF-state, to input no internal row address signal in the row decoder 2 in the period when the delay circuit 22 delays the external address signal XA by three clocks. In this period, the memory listens for entry of an internal column address signal corresponding to the external address signal XA from the column address buffer 9 (see FIG. 1) in the column decoder 14. Thus, the memory produces an idle time for performing no normal access operation in this period.

According to the first embodiment, the memory perform the refresh operation on the memory cells 20 through the idle time produced by delaying the aforementioned external address signal XA by three clocks. The memory performs the refresh operation when the sum of access frequencies reaches a prescribed value. More specifically, the refresh control circuit 5 outputs a refresh address signal RA corresponding to the memory cells 20 subjected to the refresh operation, a high-level refresh request signal REFE and a low-level inverted refresh request signal /REFE at the access operation start timing when the counter 3 of the refresh control circuit 5 detects that the sum of the access frequencies has reached the prescribed value. At this time, the memory resets the sum of the access frequencies counted by the counter 3 of the refresh control circuit 5 to "0". The n-channel transistor forming the transfer gate transistor 23b of the switching circuit 23 receiving the high-level refresh request signal REFE in the gate thereof enters an ON-state. Further, the p-channel transistor forming the transfer gate transistor 23b of the switching circuit 23 receiving the low-level inverted refresh request signal /REFE in the gate thereof also enters an ON-state. Thus, the refresh address signal RA is output through the transfer gate transistor 23b, whereby the switching circuit 23 inputs an internal row address signal RA corresponding to the refresh address signal RA in the row decoder 2. Thus, the row decoder 2 activates a single word line WL corresponding to the internal row address signal RA so that the memory performs the refresh operation on all memory cells 20 linked with the activated word line WL through the bit lines BL.

The memory performs the refresh operation similarly to the read and rewrite operations in the normal access operation. In other words, the memory collectively reads the data stored in all memory cells 20 linked with the activated word line WL through the bit lines BL, and amplifies the voltages of the read data with the sense amplifier 17. The memory applies the amplified voltages to the ferroelectric capacitors 19 of the memory cells 20 from which the data have been read through the bit lines BL, thereby rewriting the data. Thus, the memory refreshes the data stored in the memory cells 20. The memory performs this refresh operation in the idle time produced every normal access operation successively on the word lines WL included in the memory cell array 1 every word line WL. Every time the memory performs the refresh operation, the counter 3 of the refresh control circuit 5 counts up the access frequency by +1 while the address counter 4 of the refresh control circuit 5 counts up the frequency of the refresh operation corresponding to the word line WL subjected to the refresh operation by +1. The memory performs the refresh operation on all memory cells 20 linked with all word lines WL included in the memory cell array 1. After performing the refresh operation on all memory cells 20 linked with all word lines WL, the memory resets the address counter 4 of the refresh control circuit 5 to "0". Thereafter the memory repetitively performs the normal access operation again. The counter 3 of the refresh control circuit 5 counts and adds up the frequencies of the aforementioned refresh operation and the re-performed normal access operation. Thereafter the memory performs the normal access operation without the refresh operation until the sum of the frequencies of the refresh operation and the normal access operation counted by the counter 3 of the refresh control circuit 5 reaches a prescribed value.

According to the first embodiment, as hereinabove described, the memory, provided with the delay circuit 22 delaying and outputting the external address signal XA received from outside in the normal access operation, the refresh control circuit 5 outputting the refresh address signal RA corresponding to the memory cells 20 subjected to the data refresh operation and the switching circuit 23 properly switching and outputting the external address signal XA output from the delay circuit 22 and the refresh address signal RA output from the refresh control circuit 5 for performing the refresh operation on the memory cells 20 corresponding to the refresh address signal RA (internal address signal RA) output from the switching circuit 23 in the period when the delay circuit 22 delays the external address signal XA by three clocks, can produce the idle time for performing no normal access operation through the delay circuit 22 without employing a high-speed clock signal and perform the refresh operation in this idle period through the refresh control circuit 5 and the switching circuit 23. Thus, the memory can perform the refresh operation without increasing current consumption.

According to the first embodiment, further, the switching circuit 23 outputs the refresh address signal RA in place of the external address signal XA when the counter 3 detects that the sum of access frequencies has reached the prescribed value so that the memory performs the refresh operation on the memory cells 20 linked with the word line WL corresponding to this refresh address signal RA, whereby the memory can start the refresh operation before reaching a prescribed access frequency causing data disappearance by setting the aforementioned prescribed value to a prescribed access frequency requiring a refresh operation for avoiding data disappearance. Thus, the memory can reliably suppress disappearance of data stored in the memory cells 20.

(Second Embodiment)

The structure of a cross-point ferroelectric memory according to a second embodiment of the present invention is now described with reference to FIG. 5.

Figure 5:
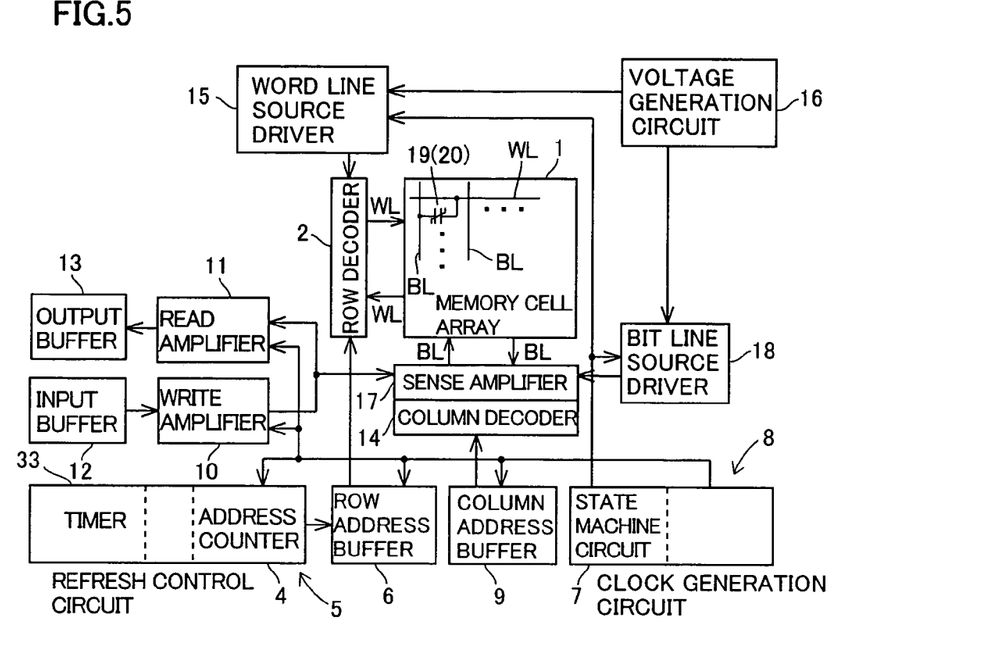
FIG. 5 is a block diagram showing the overall structure of a cross-point ferroelectric memory according to a second embodiment of the present invention.

In the cross-point ferroelectric memory according to the second embodiment, a timer 33 is provided in a refresh control circuit 5 in place of the counter 3 (see FIG. 1) according to the first embodiment as shown in FIG. 5, dissimilarly to the cross-point ferroelectric memory according to the aforementioned first embodiment. This timer 33 is an example of the "access time measuring circuit" in the present invention. The timer 33 is provided for measuring access times to memory cells 20. The refresh control circuit 5 is formed to output a refresh address signal RA, a high-level refresh request signal REFE and a low-level inverted refresh request signal /REFE to a row decoder 2 when the sum of the access times measured by the timer 33 reaches a prescribed value. The remaining structure of the cross-point ferroelectric memory according to the second embodiment is similar to that of the cross-point ferroelectric memory according to the aforementioned first embodiment.

Operations of the cross-point ferroelectric memory according to the second embodiment of the present invention are now described with reference to FIGS. 3 to 5. The cross-point ferroelectric memory according to the second embodiment detects timing for performing a refresh operation with the timer 33 of the refresh control circuit 5, dissimilarly to the aforementioned first embodiment. In other words, the timer 33 measures the access times, and integrates the measured times. When the sum of the access times measured by the timer 33 reaches a prescribed access time, the refresh control circuit 5 outputs the refresh address signal RA corresponding to the memory cells 20 subjected to the refresh operation, the high-level refresh request signal REFE and the low-level inverted refresh request signal /REFE at access operation start timing, similarly to the case of the first embodiment shown in FIG. 4. Thus, a transfer gate transistor 23b of a switching circuit 23 enters an ON-state, for outputting a refresh address signal RA (internal row address signal RA) to the row decoder 2 (see FIG. 5) therethrough similarly to the first embodiment shown in FIG. 3. Therefore, the row decoder 2 activates a word line WL corresponding to the internal row address signal RA so that the memory performs the refresh operation on all memory cells 20 linked with the activated word line WL through bit lines BL. When the sum of the access times measured by the timer 33 reaches the prescribed value, the memory resets the sum of the access times measured by the timer 33 to "0". Thereafter the timer 33 measures and adds up the time of the refresh operation and a normal access operation performed again after the refresh operation on all memory cells 20. When the sum of the times of the refresh and normal access operations measured by the timer 33 reaches the prescribed access time, the memory performs the refresh operation again.

The remaining operations of the cross-point ferroelectric memory according to the second embodiment are similar to those of the cross-point ferroelectric memory according to the aforementioned first embodiment.

According to the second embodiment, as hereinabove described, the switching circuit 23 outputs the refresh address signal RA in place of an external address signal when the sum of the access times measured by the timer 33 reaches the prescribed value so that the memory performs the refresh operation on the memory cells 20 linked with the word line WL corresponding to this refresh address signal RA, whereby the memory can start the refresh operation before reaching a prescribed access time causing data disappearance by setting the aforementioned prescribed value to a prescribed access time requiring the refresh operation for avoiding data disappearance. Thus, the memory can reliably suppress disappearance of data stored in the memory cells 20.

The remaining effects of the second embodiment are similar to those of the aforementioned first embodiment.

Although the present invention has been described and illustrated in detail, it is clearly understood that the same is by way of illustration and example only and is not to be taken by way of limitation, the spirit and scope of the present invention being limited only by the terms of the appended claims.

Figure 6:
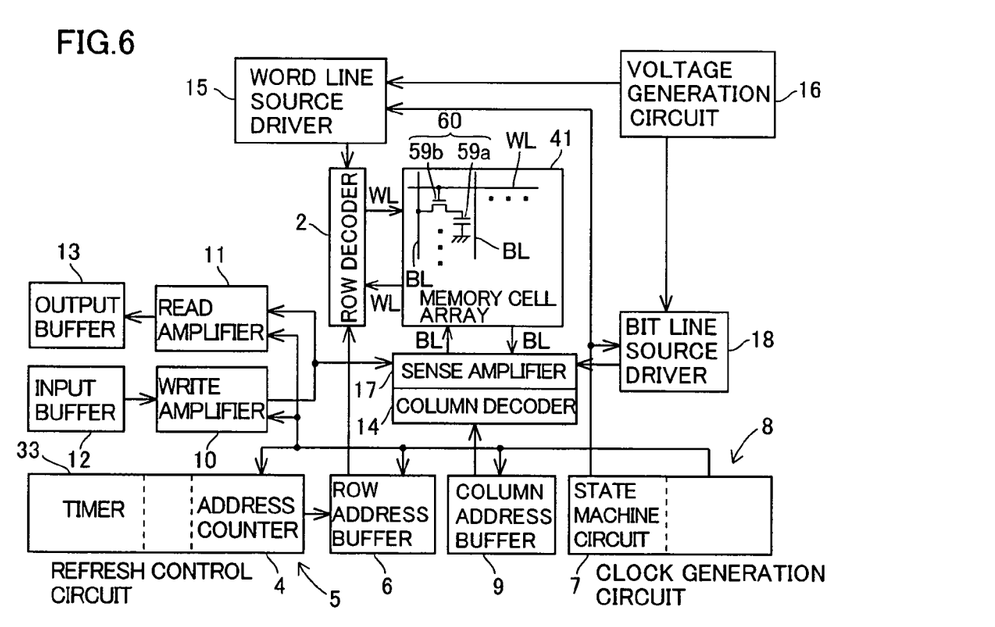
FIG. 6 is a block diagram showing the overall structure of a DRAM according to a modification of the second embodiment of the present invention.

For example, while each of the above embodiments has been described with reference to a ferroelectric memory, the present invention is not restricted to this but is also applicable to a memory other than the ferroelectric memory. The present invention is also applicable to a DRAM show in FIG. 6, for example. In the DRAM shown in FIG. 6, a plurality of memory cells 60 constituting a memory cell array 41 are formed by capacitors 59a and n-channel transistors 59b respectively. The n-channel transistors 59b are examples of the "transistor" in the present invention. First electrodes of the capacitors 59a are connected to either the sources or the drains of the n-channel transistors 59b, while second electrodes thereof are grounded. Either the drains or the sources of the n-channel transistors 59b are connected to bit lines BL, while the gates of the n-channel transistors 59b are connected to word lines WL. The remaining structure of the DRAM shown in FIG. 6 is similar to that of the ferroelectric memory according to the aforementioned second embodiment.

While the memory according to the aforementioned first embodiment delays the external address signal received for the normal access operation by three clocks, the present invention is not restricted to this but the memory may alternatively delay the external address signal by a number of clocks other than three clocks.

While the counter of the refresh control circuit counts and adds up the frequencies of the refresh and normal access operations in the aforementioned first embodiment, the present invention is not restricted to this but the counter of the refresh control circuit may alternatively count only the frequencies of the normal access operation without counting the frequencies of the refresh operation.

While the timer of the refresh control circuit measures and adds up the times of the refresh and normal access operations in the aforementioned first embodiment, the present invention is not restricted to this but the counter of the refresh control circuit may alternatively measure only the time of the normal access operation without measuring the time of the refresh operation.

What is claimed is:

1. A memory comprising:
   a plurality of memory cells storing data;
   a delay circuit outputting a first address signal corresponding to said memory cells received from outside for a normal access operation with a delay of a prescribed period;
   a refresh control circuit outputting a second address signal corresponding to any of said memory cells subjected to a refresh operation of said data; and
   a switching circuit switching and outputting said first address signal output from said delay circuit and said second address signal output from said refresh control circuit.

2. The memory according to claim 1, wherein said second address signal is outputted from said switching circuit and said refresh operation is performed on said memory cell corresponding to said second address signal during said prescribed period for which said delay circuit delays outputting said first address signal.

3. The memory according to claim 2, further comprising a plurality of word lines and a plurality of bit lines arranged to intersect with each other, so that said memory cells are provided on the intersectional positions between said plurality of word lines and said plurality of bit lines respectively,
   for performing said refresh operation on all said memory cells linked with single said word line corresponding to said second address signal during said prescribed period for which said delay circuit delays outputting said first address signal.

4. The memory according to claim 3, wherein said refresh operation is successively one by one on all said word lines every said normal access operation.

5. The memory according to claim 1, wherein
   said refresh control circuit includes an access frequency detection circuit detecting access frequencies to said memory cells,
   for performing said refresh operation on said memory cell corresponding to said second address signal in response to said second address signal output from said switching circuit in place of said first address signal when said access frequency detection circuit detects that the sum of said access frequencies has reached a prescribed value.

6. The memory according to claim 1, wherein
   said refresh control circuit includes an access time measuring circuit measuring access times to said memory cells,
   for performing said refresh operation on said memory cell corresponding to said second address signal in response to said second address signal output from said switching circuit in place of said first address signal when the sum of said access times measured by said access time measuring circuit reaches a prescribed time.

7. The memory according to claim 1, further comprising an address holding circuit holding said first address signal corresponding to said memory cells subjected to said normal access operation, wherein
   said delay circuit delays outputting said first address signal held by said address holding circuit.

8. The memory according to claim 1, wherein
   said delay circuit includes a plurality of serially connected delay circuit parts, for outputting said first address signal with a delay of said prescribed period by outputting said first address signal from each of said plurality of delay circuit parts with a delay of one clock.

9. The memory according to claim 1, wherein
   said switching circuit includes a first transistor receiving said first address signal from said delay circuit and a second transistor receiving said second address signal from said refresh control circuit,
   for outputting said first address signal through said first transistor by turning on said first transistor and turning off said second transistor in said normal access operation, and
   outputting said second address signal through said second transistor by turning off said first transistor and turning on said second transistor in said refresh operation.

10. The memory according to claim 1, further comprising a plurality of word lines and a plurality of bit lines arranged to intersect with each other, wherein
    said memory cells are arranged on positions corresponding to the intersections between said plurality of word lines and said plurality of bit lines respectively and include ferroelectric capacitors connected to corresponding said word lines and corresponding said bit lines for storing said data.

11. The memory according to claim 1, further comprising a plurality of word lines and a plurality of bit lines arranged to intersect with each other, wherein said memory cells are arranged on positions corresponding to the intersections between said plurality of word lines and said plurality of bit lines respectively and include transistors having either sources or drains connected to corresponding said bit lines as well as capacitors having first electrodes connected to either said drains or said sources of said transistors and grounded second electrodes for storing said data.

12. A memory comprising:

a plurality of word lines and a plurality of bit lines arranged to intersect with each other;

a plurality of memory cells arranged on positions corresponding to the intersections between said plurality of word lines and said plurality of bit lines respectively and including ferroelectric capacitors connected to corresponding said word lines and corresponding said bit lines for storing data;

a delay circuit outputting a first address signal corresponding to said memory cells received from outside for a normal access operation with a delay of a prescribed period;

a refresh control circuit outputting a second address signal corresponding to any of said memory cells subjected to a refresh operation of said data; and a switching circuit switching and outputting said first address signal output from said delay circuit and said second address signal output from said refresh control circuit.

13. The memory according to claim 12, wherein said second address signal is outputted from said switching circuit and said refresh operation is performed on said memory cell corresponding to said second address signal during said prescribed period for which said delay circuit delays outputting said first address signal.

14. The memory according to claim 13, wherein said refresh operation is performed on all said memory cells linked with single said word line corresponding to said second address signal during said prescribed period for which said delay circuit delays outputting said first address signal.

15. The memory according to claim 14, wherein said refresh operation is successively performed one by one on all said word lines every said normal access operation.

16. The memory according to claim 12, wherein said refresh control circuit includes an access frequency detection circuit detecting access frequencies to said memory cells, for performing said refresh operation on said memory cell corresponding to said second address signal in response to said second address signal output from said switching circuit in place of said first address signal when said access frequency detection circuit detects that the sum of said access frequencies has reached a prescribed value.

17. The memory according to claim 12, wherein said refresh control circuit includes an access time measuring circuit measuring access times to said memory cells, for performing said refresh operation on said memory cell corresponding to said second address signal in response to said second address signal output from said switching circuit in place of said first address signal when the sum of said access times measured by said access time measuring circuit reaches a prescribed time.

18. The memory according to claim 12, further comprising an address holding circuit holding said first address signal corresponding to said memory cells subjected to said normal access operation, wherein said delay circuit delays outputting said first address signal held by said address holding circuit.

19. The memory according to claim 12, wherein said delay circuit includes a plurality of serially connected delay circuit parts, for outputting said first address signal with a delay of said prescribed period by outputting said first address signal from each of said plurality of delay circuit parts with a delay of one clock.

20. The memory according to claim 12, wherein said switching circuit includes a first transistor receiving said first address signal from said delay circuit and a second transistor receiving said second address signal from said refresh control circuit, for outputting said first address signal through said first transistor by turning on said first transistor and turning off said second transistor in said normal access operation, and outputting said second address signal through said second transistor by turning off said first transistor and turning on said second transistor in said refresh operation.

* * * * *